(12) United States Patent
Nagatomo et al.

(10) Patent No.: US 12,113,509 B2
(45) Date of Patent: Oct. 8, 2024

(54) ACOUSTIC WAVE DEVICE WITH IDT ELECTRODE INCLUDING AL METAL LAYER AND HIGH ACOUSTIC IMPEDANCE METAL LAYER

(71) Applicant: Murata Manufacturing Co., Ltd., Nagaokakyo (JP)

(72) Inventors: Shou Nagatomo, Nagaokakyo (JP); Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 620 days.

(21) Appl. No.: 17/482,660

(22) Filed: Sep. 23, 2021

(65) Prior Publication Data

US 2022/0014175 A1    Jan. 13, 2022

Related U.S. Application Data

(63) Continuation of application No. PCT/JP2020/014839, filed on Mar. 31, 2020.

(30) Foreign Application Priority Data

Apr. 4, 2019  (JP) .................................. 2019-071735

(51) Int. Cl.
  *H03H 9/25* (2006.01)
  *H03H 9/02* (2006.01)
  *H03H 9/145* (2006.01)

(52) U.S. Cl.
  CPC .......... *H03H 9/25* (2013.01); *H03H 9/02559* (2013.01); *H03H 9/02866* (2013.01); *H03H 9/14541* (2013.01)

(58) Field of Classification Search
  CPC ................. H03H 9/25; H03H 9/02559; H03H 9/02866; H03H 9/14541; H03H 9/02574
  See application file for complete search history.

(56) References Cited

U.S. PATENT DOCUMENTS 9,319,023 B2 *   4/2016   Tanaka ................. H03H 9/1452
10,425,060 B2 *  9/2019   Nakamura ............... H03H 9/64
(Continued)

FOREIGN PATENT DOCUMENTS

JP   2001-094382 A   4/2001
JP   2012-222458 A   11/2012
(Continued)

OTHER PUBLICATIONS

Official Communication issued in International Patent Application No. PCT/JP2020/014839, mailed on Jun. 23, 2020.

*Primary Examiner* — Emily P Pham
(74) *Attorney, Agent, or Firm* — Keating & Bennett, LLP

(57) ABSTRACT

An acoustic wave device includes an energy confinement layer, a piezoelectric layer made of Y-cut X-propagation lithium tantalate having a cut angle in a range from about −10° to about 65°, and an IDT electrode. Electrode fingers of the IDT electrode include an Al metal layer and a high acoustic impedance metal layer having a Young's modulus equal to or more than about 200 GPa and an acoustic impedance higher than Al. The high acoustic impedance metal layer is closer to the piezoelectric layer than the Al metal layer. A wavelength specific film thickness $t_{LT}$ of the piezoelectric layer is expressed by $t_{LT} \leq 1\lambda$. The total of normalized film thicknesses obtained by normalizing the film thickness of each layer of the electrode finger by a density and Young's modulus of the Al metal layer satisfies $T \leq 0.1125 t_{LT} + 0.0574$.

18 Claims, 9 Drawing Sheets

(56) References Cited

U.S. PATENT DOCUMENTS

| | | | |
|---|---|---|---|
| 10,700,662 B2* | 6/2020 | Miura | H03H 9/02897 |
| 2013/0285768 A1 | 10/2013 | Watanabe et al. | |
| 2014/0152146 A1 | 6/2014 | Kimura et al. | |
| 2014/0203893 A1 | 7/2014 | Kando et al. | |

FOREIGN PATENT DOCUMENTS

| | | |
|---|---|---|
| WO | 2012/086441 A1 | 6/2012 |
| WO | 2012/086639 A1 | 6/2012 |
| WO | 2013/047433 A1 | 4/2013 |

\* cited by examiner

ACOUSTIC WAVE DEVICE WITH IDT ELECTRODE INCLUDING AL METAL LAYER AND HIGH ACOUSTIC IMPEDANCE METAL LAYER

CROSS REFERENCE TO RELATED APPLICATIONS

This application claims the benefit of priority to Japanese Patent Application No. 2019-071735 filed on Apr. 4, 2019 and is a Continuation Application of PCT Application No. PCT/JP2020/014839 filed on Mar. 31, 2020. The entire contents of each application are hereby incorporated herein by reference.

BACKGROUND OF THE INVENTION

1. Field of the Invention

The present invention relates to an acoustic wave device.

2. Description of the Related Art

Existing acoustic wave devices have been widely used for a filter of a cellular phone or the like. International Publication No. 2012/086639, which will be described below, discloses an example of the acoustic wave device. In this acoustic wave device, a support substrate, a high-acoustic-velocity film, a low-acoustic-velocity film, and a piezoelectric film are laminated in this order, and an IDT (Inter Digital Transducer) electrode is provided on the piezoelectric film. A Q value is increased by providing the above-described laminated structure.

When a generally known Al electrode is applied as the IDT electrode of the acoustic wave device described above, an effect of increasing the Q value can be obtained. However, since the Young's modulus of Al is relatively small, there is a limit to the Q value that can be obtained, and such a Q value is sometimes insufficient for the desired Q value.

SUMMARY OF THE INVENTION

Preferred embodiments of the present invention provide acoustic wave devices each having an improved Q characteristic.

An acoustic wave device according to a preferred embodiment of the present invention includes an energy confinement layer, a piezoelectric layer on the energy confinement layer and made of Y-cut X-propagation lithium tantalate having a cut angle of equal to or more than about −10° and equal to or less than about 65°, and an IDT electrode on the piezoelectric layer, wherein the IDT electrode includes a plurality of electrode fingers, the plurality of electrode fingers including a multilayer body including an Al metal layer defined by an Al layer or an alloy layer including Al, and a high acoustic impedance metal layer that has a Young's modulus equal to or more than about 200 GPa and a higher acoustic impedance than Al, the high acoustic impedance metal layer is located closer to the piezoelectric layer than the Al metal layer, when a wavelength defined by an electrode finger pitch of the IDT electrode is denoted by $\lambda$ and a wavelength specific film thickness of the piezoelectric layer is denoted by $t_{LT}$, $t_{LT} \leq 1\lambda$ is satisfied, and a total of normalized film thicknesses obtained by normalizing a film thickness of each layer of the electrode finger by a density and a Young's modulus of the Al metal layer is denoted by T, the following Expression 1 is satisfied.

$$T \leq 0.1125 t_{LT} + 0.0574 \qquad \text{Expression 1}$$

An acoustic wave device according to a preferred embodiment of the present invention includes an energy confinement layer, a piezoelectric layer on the energy confinement layer and made of Y-cut X-propagation lithium tantalate having a cut angle of equal to or more than about −10° and equal to or less than about 65°, and an IDT electrode on the piezoelectric layer, wherein the IDT electrode includes a plurality of electrode fingers, the plurality of electrode fingers including a multilayer body including an Al metal layer defined by an Al layer or an alloy layer including Al, and a high acoustic impedance metal layer that has a Young's modulus equal to or more than about 200 GPa and a higher acoustic impedance than Al, the high acoustic impedance metal layer is located closer to the piezoelectric layer than the Al metal layer, the high acoustic impedance metal layer is an Mo layer, a W layer, or an Ru layer, the following Expression 2 is satisfied, and a combination of each coefficient of Expression 2 and a metal of the high acoustic impedance metal layer is a combination shown in Table 1 below.

$$a_0^{(2)}(t_{LT}-c_0)^2 + a_0^{(1)}(t_{LT}-c_0) + b_0 \leq a_{LT}^{(2)}(t_{LT}-c_{LT})^2 + a_{LT}^{(1)}(t_{LT}-c_{LT}) + a_M^{(2)}(T-c_M)^2 + a_M^{(1)}(T-c_M) + d_{LT-M}(t_{LT}-c_{LT})(T-c_M) + b \qquad \text{Expression 2}$$

TABLE 1

| | METAL FORMING HIGH ACOUSTIC IMPEDANCE METAL LAYER | | |
|---|---|---|---|
| COEFFICIENT | Mo | W | Ru |
| a0(2) | | 12315.2368 | |
| a0(1) | | 2360.5990 | |
| c0 | | 0.2250 | |
| b0 | | 6287.8999 | |
| aLT(2) | −54656.6400 | −57176.4500 | −51809.7600 |
| aLT(1) | 12799.3184 | 10774.6530 | 13577.4784 |
| cLT | 0.2250 | 0.2250 | 0.2250 |
| aM(2) | −256136.5936 | −252048.6950 | −177802.3113 |
| aM(1) | −22623.1348 | −15612.4350 | −22797.2384 |
| cM | 0.0844 | 0.0851 | 0.0816 |
| dLT-M | 0.0000 | 72370.3153 | 0.0000 |
| b | 6481.5295 | 6416.9953 | 6416.0623 |

With acoustic wave devices according to preferred embodiments of the present invention, Q characteristics are able to be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing preferred embodiments of the present invention with reference to the drawings.

The preferred embodiments described in the present specification are exemplary, and partial replacement or combination of components between different preferred embodiments is possible.

Figure 1:
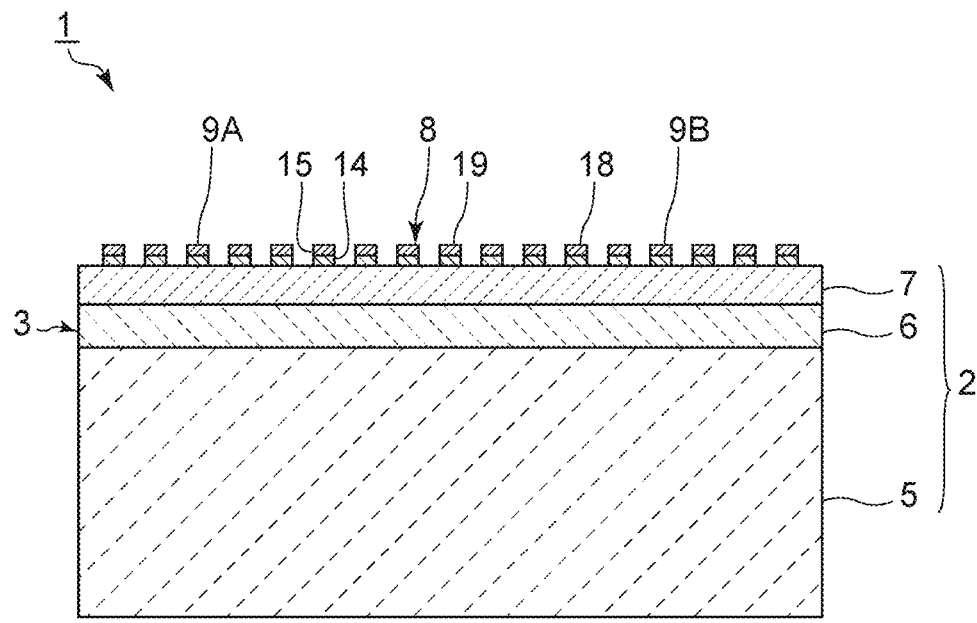
FIG. 1 is a front sectional view of an acoustic wave device according to a first preferred embodiment of the present invention.

FIG. 1 is a front sectional view of an acoustic wave device according to a first preferred embodiment of the present invention.

An acoustic wave device 1 includes a piezoelectric substrate 2. The piezoelectric substrate 2 of the present preferred embodiment includes an energy confinement layer 3 and a piezoelectric layer 7 provided on the energy confinement layer 3. The energy confinement layer 3 of the present preferred embodiment is a multilayer body including a high-acoustic-velocity support substrate 5 as a high-acoustic-velocity material layer and a low-acoustic-velocity film 6 provided on the high-acoustic-velocity support substrate 5. The piezoelectric layer 7 is a piezoelectric layer using Y-cut X-propagation lithium tantalate having a cut angle of equal to or more than about −10° and equal to or less than about 65°, for example.

An IDT electrode 8 is provided on the piezoelectric layer 7 of the piezoelectric substrate 2. An acoustic wave is excited by applying an AC voltage to the IDT electrode 8. A pair of reflectors 9A and 9B are provided on both sides of the IDT electrode 8 in an acoustic wave propagation direction on the piezoelectric substrate 2. The acoustic wave device 1 of the present preferred embodiment is an acoustic wave resonator, for example. However, the acoustic wave device 1 according to the present invention is not limited to an acoustic wave resonator, and may be, for example, a filter device or the like having a plurality of acoustic wave resonators.

The low-acoustic-velocity film 6 is a film having a relatively low acoustic velocity. More specifically, an acoustic velocity of a bulk wave propagating through the low-acoustic-velocity film 6 is lower than an acoustic velocity of a bulk wave propagating through the piezoelectric layer 7. In the present preferred embodiment, the low-acoustic-velocity film 6 is, for example, a silicon oxide film. Silicon oxide is represented by SiOx. x is an arbitrary positive number. In the acoustic wave device 1, for example, silicon oxide of the low-acoustic-velocity film 6 is $SiO_2$. Note that the material of the low-acoustic-velocity film 6 is not limited to the above, and for example, a material including glass, silicon oxynitride, tantalum oxide, or a compound obtained by adding fluorine, carbon, boron, hydrogen, or a silanol group to silicon oxide as a main component can be used.

The high-acoustic-velocity material layer is a layer made of a material having a relatively high acoustic velocity. More specifically, an acoustic velocity of a bulk wave propagating through the high-acoustic-velocity material layer is higher than an acoustic velocity of an acoustic wave propagating through the piezoelectric layer 7. As the material of the high-acoustic-velocity support substrate 5 that is the high-acoustic-velocity material layer, for example, aluminum oxide, silicon carbide, silicon nitride, silicon oxynitride, silicon, sapphire, lithium tantalate, lithium niobate, crystal, alumina, zirconia, cordierite, mullite, steatite, forsterite, magnesia, a DLC (diamond-like carbon) film, diamond, or the like, and media containing these materials as a main component can be used.

Since the acoustic wave device 1 of the present preferred embodiment has a configuration in which the piezoelectric layer 7 is laminated on the energy confinement layer 3 that is a multilayer body including the high-acoustic-velocity support substrate 5 and the low-acoustic-velocity film 6, the energy of the acoustic wave can be effectively confined to the piezoelectric layer 7 side. The low-acoustic-velocity film 6 may not be provided. In the present preferred embodiment, the piezoelectric layer 7 is indirectly provided on the high-acoustic-velocity material layer via the low-acoustic-velocity film 6, but the piezoelectric layer 7 may be directly provided on the high-acoustic-velocity material layer.

Figure 2:
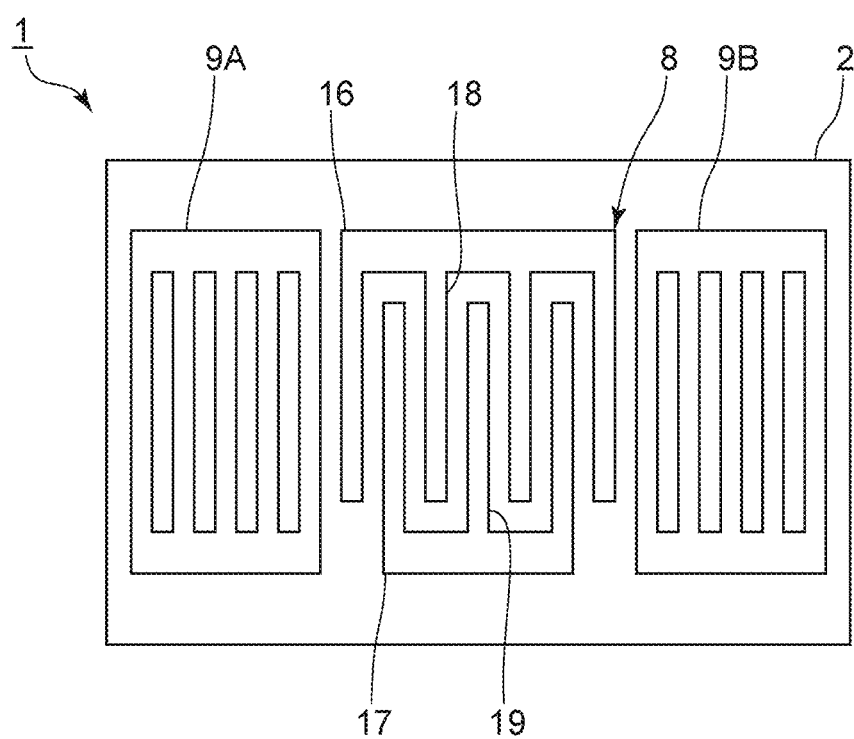
FIG. 2 is a plan view of the acoustic wave device according to the first preferred embodiment of the present invention.

FIG. 2 is a plan view of the acoustic wave device according to the first preferred embodiment of the present invention.

The IDT electrode 8 includes a first bus bar 16 and a second busbar 17 facing each other. The IDT electrode 8 includes a plurality of first electrode fingers 18 each including one end connected to the first busbar 16. Further, the IDT electrode 8 includes a plurality of second electrode fingers 19 each including one end connected to the second busbar 17. The plurality of first electrode fingers 18 and the plurality of second electrode fingers 19 are interdigitated with each other.

As illustrated in FIG. 1, the IDT electrode 8 is provided of a multilayer body including an Al metal layer 15 and a high acoustic impedance metal layer 14. The Al metal layer 15 is an Al layer or an alloy layer including Al, for example. In the present preferred embodiment, the Al metal layer 15 is an Al layer. The high acoustic impedance metal layer 14 in the IDT electrode 8 is a metal layer having a Young's modulus equal to or more than about 200 GPa and an acoustic impedance higher than that of Al. The high acoustic impedance metal layer 14 in the acoustic wave device 1 is, for example, an Mo layer, a W layer, or an Ru layer. However, the high acoustic impedance metal layer 14 is not limited to the above. The high acoustic impedance metal layer 14 is located closer to the piezoelectric layer 7 than the Al metal layer 15.

When a wavelength defined by an electrode finger pitch of the IDT electrode 8 is λ and a wavelength specific film thickness of the piezoelectric layer 7 is $t_{LT}$, $t_{LT} \leq 1\lambda$ is satisfied. The electrode finger pitch refers to a distance between the centers of the electrode fingers of the IDT electrode 8.

The total of normalized film thicknesses obtained by normalizing the film thickness of each layer of the electrode finger of the IDT electrode 8 by the density and the Young's modulus of the Al metal layer 15 is denoted by T. T is the total of the above-described normalized film thicknesses of an arbitrary electrode finger among the plurality of electrode fingers included in the IDT electrode 8. In the present preferred embodiment, T of any of the first electrode fingers 18 and T of any of the second electrode fingers 19 are the same or substantially the same. Here, it is assumed that the wavelength specific film thickness of an arbitrary metal type i is ti, the density is $\rho_i$, and the Young's modulus is $Y_i$. i is a positive number of 0 or more, and i=0 means a metal type of the Al metal layer 15. The wavelength specific film thickness of the Al metal layer 15 is t0, the density is $\rho_0$, and the Young's modulus is $Y_0$. The inventors of preferred embodiments of the present invention discovered that, by being defined as described above, the total film thickness T of each layer of the plurality of first electrode fingers 18 and the plurality of second electrode fingers 19 of the IDT electrode 8 normalized by the density $\rho_0$ and the Young's modulus $Y_0$ of the Al metal layer 15 can be expressed as follows.

$$T = \sum_{i=0} t_i \frac{\rho_i}{\rho_0} \frac{Y_i}{Y_0}$$

Hereinafter, the film thickness normalized by the density $\rho_0$ and the Young's modulus $Y_0$ of the Al metal layer 15 may be simply referred to as a normalized film thickness. Here, in the acoustic wave device 1, the relationship between the total T of the normalized film thicknesses of each layer of the electrode finger of the IDT electrode 8 and the wavelength specific film thickness $t_{LT}$ of the piezoelectric layer 7 satisfies the following Expression 1.

$$T \leq 0.1125 t_{LT} + 0.0574 \quad \text{Expression 1}$$

Further, the acoustic wave device 1 satisfies the following Expression 2. In the case where the high acoustic impedance metal layer 14 is an Mo layer, in the case of a W layer, and in the case of an Ru layer, each coefficient of Expression 2 takes a value as shown in Table 2 below.

$$a_0^{(2)}(t_{LT}-c_0)^2 + a_0^{(1)}(t_{LT}-c_0) + b_0 \leq a_{LT}^{(2)}(t_{LT}-c_{LT})^2 + a_{LT}^{(1)}(t_{LT}-c_{LT}) + a_M^{(2)}(T-c_M)^2 + a_M^{(1)}(T-c_M) + d_{LT-M}(t_{LT}-c_{LT})(T-c_M) + b \quad \text{Expression 2}$$

TABLE 2

| COEFFICIENT | METAL FORMING HIGH ACOUSTIC IMPEDANCE METAL LAYER | | |
| --- | --- | --- | --- |
| | Mo | W | Ru |
| a0(2) | | 12315.2368 | |
| a0(1) | | 2360.5990 | |
| c0 | | 0.2250 | |
| b0 | | 6287.8999 | |
| aLT(2) | −54656.6400 | −57176.4500 | −51809.7600 |
| aLT(1) | 12799.3184 | 10774.6530 | 13577.4784 |
| cLT | 0.2250 | 0.2250 | 0.2250 |
| aM(2) | −256136.5936 | −252048.6950 | −177802.3113 |
| aM(1) | −22623.1348 | −15612.4350 | −22797.2384 |
| cM | 0.0844 | 0.0851 | 0.0816 |
| dLT-M | 0.0000 | 72370.3153 | 0.0000 |
| b | 6481.5295 | 6416.9953 | 6416.0623 |

However, as long as Expression 1 is satisfied, Expression 2 does not necessarily need to be satisfied.

The present preferred embodiment has the following configuration. 1) The first electrode finger 18 and the second electrode finger 19 of the IDT electrode 8 include a multilayer body including the Al metal layer 15 and the high acoustic impedance metal layer 14, and the high acoustic impedance metal layer 14 is located closer to the piezoelectric layer 7 than the Al metal layer 15. 2) The Young's modulus of the high acoustic impedance metal layer 14 is equal to or more than about 200 GPa. 3) $t_{LT} \leq 1\lambda$ and the above-described Expression 1 is satisfied. 4) The above-described Expression 2 is satisfied and a combination of each coefficient of Expression 2 and the metal of the high acoustic impedance metal layer 14 is a combination shown in Table 2. As a result, the Q characteristic can be improved and the energy loss can be effectively reduced. This will be described below.

Note that in the present specification, the Q characteristic is a characteristic represented by f×Q that is a product of a frequency f and a Q value. Hereinafter, the film thickness may be expressed as t/λ×100(%), where t is the film thickness.

Figure 3A:
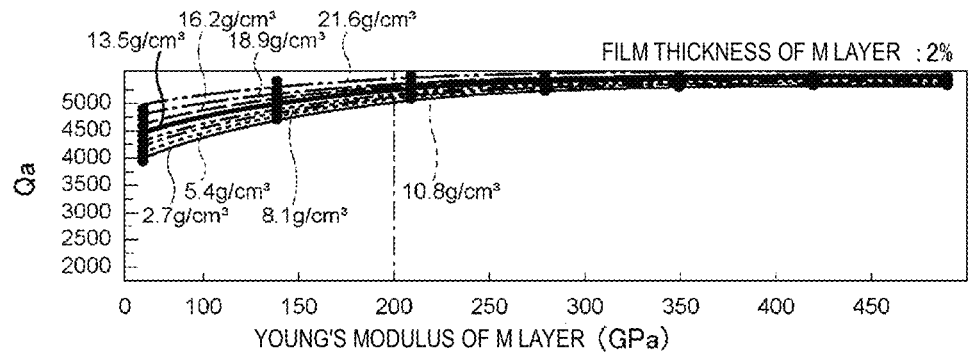
FIGS. 3A to 3C are diagrams showing the relationship between the Young's modulus of an M layer that is a metal layer corresponding to a high acoustic impedance metal layer, and the Q value.
Figure 3B:
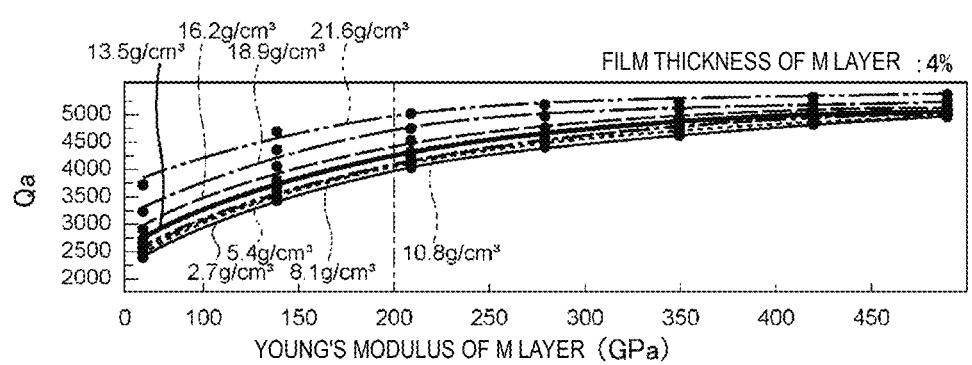
Figure 3C:
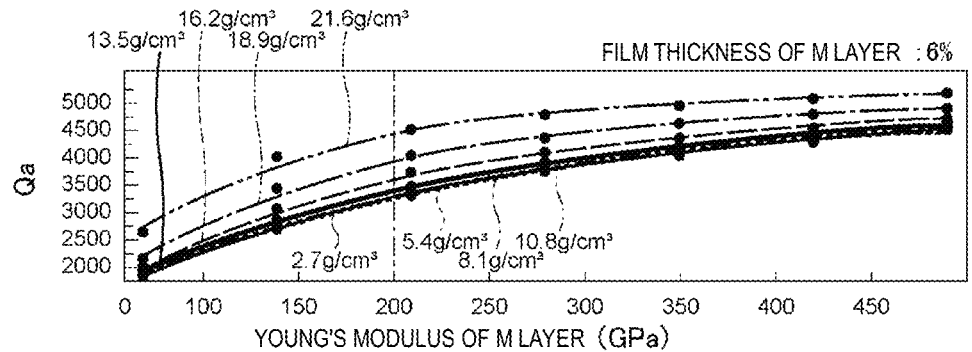

With reference to FIGS. 3A to 3C, it will be described that 1) the high acoustic impedance metal layer 14 is located closer to the piezoelectric layer 7 than the Al metal layer 15 in the multilayer body forming the first electrode finger 18 and the second electrode finger 19 of the IDT electrode 8, and 2) the Young's modulus of the high acoustic impedance metal layer 14 is equal to or more than about 200 GPa, thus being able to increase the Q value. With reference to FIG. 4 to FIG. 10, it will be described that 3) $t_{LT} \leq 1\lambda$ and the Expression 1 is satisfied, thus being able to improve the Q characteristic and reduce the energy loss. Further, with reference to FIG. 6 and the like, 4) it is shown that the Expression 2 is satisfied and the combination of each coefficient of Expression 2 and the metal of the high acoustic impedance metal layer 14 is the combination shown in the above-described Table 2, thus being able to increase the Q value more reliably.

Here, a metal layer corresponding to the high acoustic impedance metal layer in the first preferred embodiment is referred to as an M layer. In order to obtain the relationship between the Young's modulus of the M layer and the Q value, a simulation by the finite element method was performed by changing the density and the Young's modulus of the M layer. Note that the above-described simulation was performed under the condition that the acoustic wave device did not include the low-acoustic-velocity film and the piezoelectric layer was directly provided on the high-acoustic-velocity support substrate. More specifically, the conditions are as follows.

Layer configuration of IDT electrode: M layer/Al layer from the piezoelectric layer side
Density of M layer: about 2.7 g/cm$^3$, about 5.4 g/cm$^3$, about 8.1 g/cm$^3$, about 10.8 g/cm$^3$, about 13.5 g/cm$^3$, about 16.2 g/cm$^3$, about 18.9 g/cm$^3$, or about 21.6 g/cm$^3$
Film thickness of M layer: about 2%, about 4%, or about 6%
Film thickness of Al layer: about 7%
Material of piezoelectric layer: about 42° Y-cut lithium tantalate (42Y-LiTaO$_3$)
Film thickness of piezoelectric layer: about 0.3λ
Layer configuration of energy confinement layer: high-acoustic-velocity support substrate
Material of high-acoustic-velocity support substrate: Z-cut X-propagation crystal FIGS. 3A to 3C are diagrams showing the relationship between the Young's modulus of the M layer, which is a metal layer corresponding to the high acoustic impedance metal layer, and the Q value. FIG. 3A shows the dependence of the Q value on the Young's modulus of the M layer in each case where the film thickness of the M layer is about 2% and the density of the M layer is varied. FIG. 3B shows the dependence of the Q value on the Young's modulus of the M layer in each case where the film thickness of the M layer is about 4% and the density of the M layer is varied. FIG. 3C shows the dependence of the Q value on the Young's modulus of the M layer in each case where the film thickness of the M layer is about 6% and the density of the M layer is varied.

As shown in FIG. 3A, it can be seen that the Q value increases stably when the Young's modulus of the M layer is equal to or more than about 200 GPa regardless of the density of the M layer. Similarly, as shown in FIGS. 3B and 3C, it can be seen that even in a case where the film thickness of the M layer is different, when the Young's modulus of the M layer is equal to or more than about 200 GPa, the Q value stably increases. Therefore, in the first preferred embodiment illustrated in FIG. 1, since the Young's modulus of the high acoustic impedance metal layer 14 is equal to or more than about 200 GPa, the Q value can be stably increased.

Figure 4:
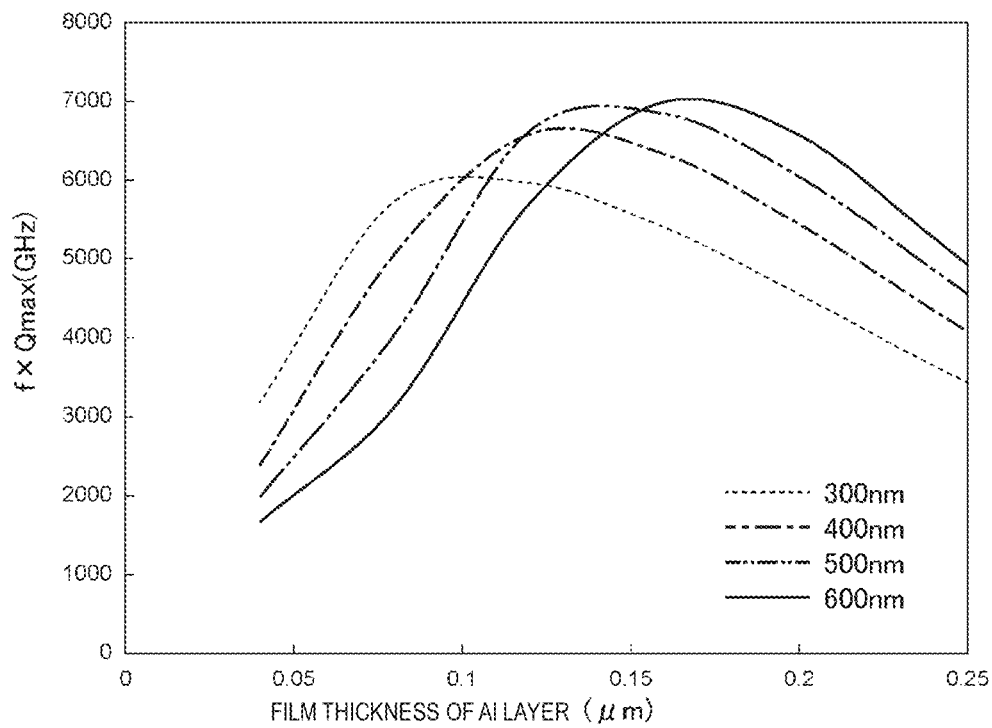
FIG. 4 is a diagram showing the Q characteristic for each film thickness of a piezoelectric layer in the case where the IDT electrode includes only an Al layer.

FIG. 4 shows the Q characteristics of an acoustic wave device that differs from the first preferred embodiment in that the IDT electrode includes only an Al layer. The conditions of the acoustic wave device whose Q characteristics were measured are as follows. Note that a region where adjacent electrode fingers of the IDT electrode overlap each other when viewed in the acoustic wave propagation direction is referred to as an intersecting region. A dimension of the intersecting region along a direction orthogonal or substantially orthogonal to the acoustic wave propagation direction is defined as an intersecting width.

Layer configuration of IDT electrode: Al layer
Wavelength λ of IDT electrode: about 2 μm
Number of pairs of electrode fingers of IDT electrode: 100 pairs
Intersecting width of IDT electrode: about 15λ
Number of electrode fingers of reflector: 10

Material of piezoelectric layer: about 55° Y-cut lithium tantalate (55Y-LiTaO$_3$)
Film thickness of piezoelectric layer: about 0.15λ or more and about 0.3λ or less
Layer configuration of energy confinement layer: high-acoustic-velocity support substrate/low-acoustic-velocity film
Material of low-acoustic-velocity film: silicon oxide FIG. 4 is a diagram showing the Q characteristics for each film thickness of the piezoelectric layer in the case where the IDT electrode includes only an Al layer. In FIG. 4, the broken line indicates the results in the case where the film thickness of the piezoelectric layer is about 300 nm, the alternate long and short dash line indicates the results in the case where the film thickness of the piezoelectric layer is about 400 nm, the alternate long and two short dashes line indicates the results in the case where the film thickness of the piezoelectric layer is about 500 nm, and the solid line indicates the results in the case where the film thickness of the piezoelectric layer is about 600 nm.

As shown in FIG. 4, it is understood that even when the film thickness of the piezoelectric layer is any of the film thicknesses, there is a film thickness of the electrode finger of the IDT electrode in which the Q characteristic has the maximum value. When the film thickness of the electrode finger is too thin with respect to the film thickness of the piezoelectric layer, a reflection coefficient becomes small, and thus the Q characteristic becomes low. On the other hand, when the film thickness of the electrode finger is too large, a large amount of energy is distributed in the metal layer of the IDT electrode having a relatively large loss of acoustic energy, and the Q characteristic is deteriorated. Therefore, there is a film thickness of the electrode finger in which the Q characteristic has the maximum value. In addition, when the film thickness of the piezoelectric layer is increased, a relatively large amount of acoustic energy is distributed in a piezoelectric single crystal having a small acoustic loss. Therefore, in the range in which energy confinement is established, the maximum value of the Q characteristic that can be achieved increases as the wavelength specific film thickness of the piezoelectric layer increases. Here, the film thickness of the electrode finger of the IDT electrode when the Q characteristic has the maximum value in the case where the IDT electrode includes only the Al layer is defined as $T_0$. As the film thickness of the electrode finger increases to $T_0$, the Q characteristic increases and an electric resistance value of the electrode finger decreases.

As shown in FIG. 4, $T_0$ varies depending on the film thickness of the piezoelectric layer. The inventors of preferred embodiments of the present invention derived the following approximate expression to obtain $T_0$ using the wavelength specific film thickness $t_{LT}$ of the piezoelectric layer. Note that in the following approximate expression, $T_0$ represents a wavelength specific film thickness.

$$T_0 \approx 0.1125 t_{LT} + 0.0574$$

Figure 5:
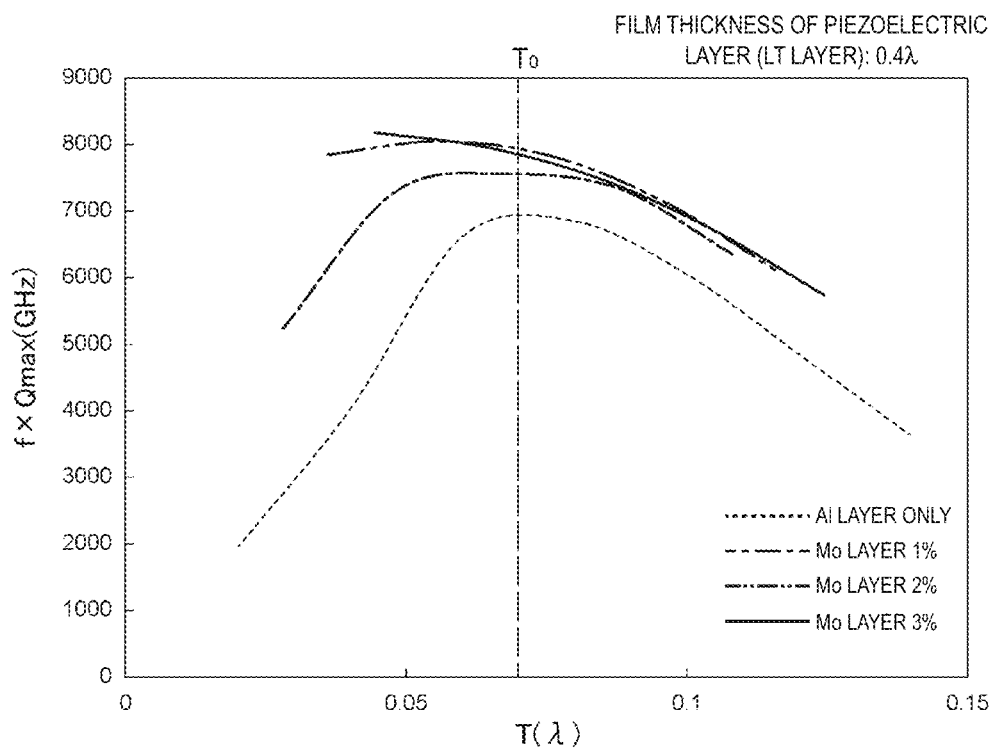
FIG. 5 is a diagram showing Q characteristics in the case where the IDT electrode includes only an Al layer or an Mo layer and an Al layer, and the piezoelectric layer has a film thickness of about 0.4λ.
Figure 6:
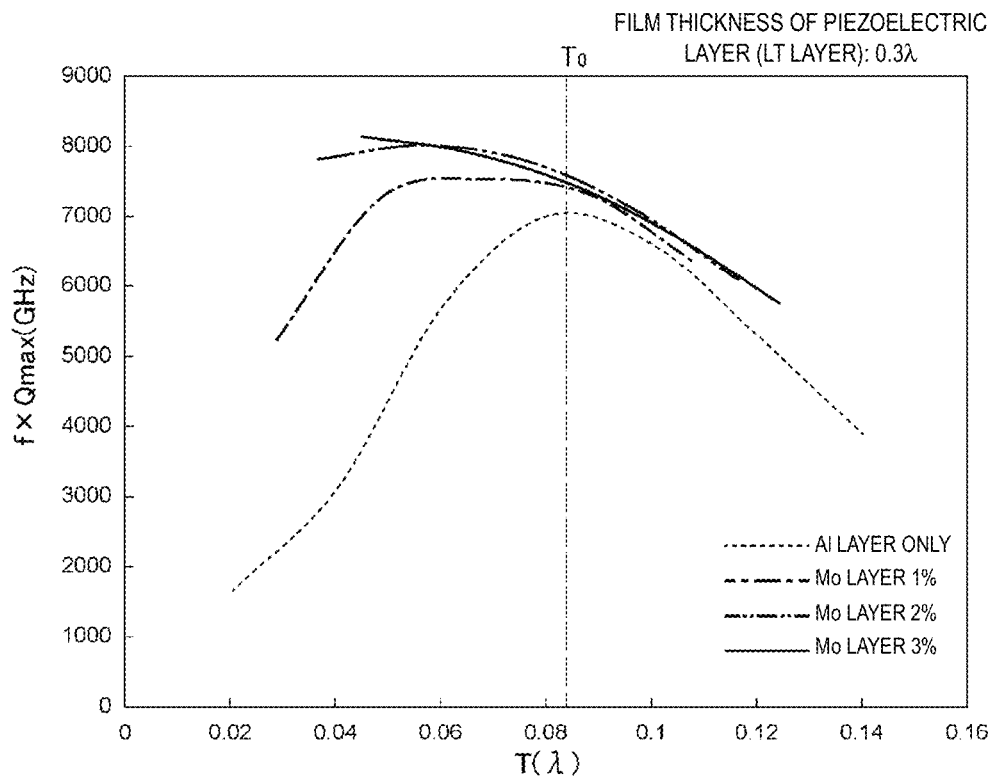
FIG. 6 is a diagram showing Q characteristics in the case where the IDT electrode includes only an Al layer or an Mo layer and an Al layer, and the piezoelectric layer has a film thickness of about 0.3λ.

FIG. 5 and FIG. 6 show the Q characteristics of an acoustic wave device in which the IDT electrode includes a multilayer body including an Al layer as an Al metal layer and a Mo layer as a high acoustic impedance metal layer. The conditions of the acoustic wave device are as follows.

Layer configuration of IDT electrode: Mo layer/Al layer from the piezoelectric layer side
Wavelength λ of IDT electrode: about 2 μm Number of pairs of electrode fingers of IDT electrode: 100 pairs
Intersecting width of IDT electrode: about 15λ

Number of electrode fingers of reflector: 10

Material of piezoelectric layer: about 55° Y-cut lithium tantalate (55Y-LiTaO$_3$)

Film thickness of piezoelectric layer: about 0.3λ or about 0.4λ

Layer configuration of energy confinement layer: high-acoustic-velocity support substrate/low-acoustic-velocity film Material of low-acoustic-velocity film: silicon oxide FIG. 5 and FIG. 6, which will be described below, show changes in the Q characteristics when the total film thickness T of each layer of the electrode finger of the IDT electrode is changed by changing the film thickness of the Al layer in the case where the film thickness of the Mo layer is about 0%, about 1%, about 2%, or about 3%.

FIG. 5 is a diagram showing Q characteristics in the case where the IDT electrode includes only an Al layer or an Mo layer and an Al layer, and the piezoelectric layer has a film thickness of about 0.4λ. FIG. 6 is a diagram showing Q characteristics in the case where the IDT electrode includes only an Al layer or an Mo layer and an Al layer, and the piezoelectric layer has a film thickness of about 0.3λ. In FIG. 5 and FIG. 6, the alternate long and short dash line indicates the result in the case where the film thickness of the Mo layer is about 1%, the alternate long and two short dashes line indicates the result in the case where the film thickness of the Mo layer is about 2%, and the solid line indicates the result in the case where the film thickness of the Mo layer is about 3%. The broken line indicates the result in the case where the IDT electrode includes only an Al layer. In FIG. 5, the above-described film thickness $T_0$ of the electrode finger of the IDT electrode when the Q characteristic has the maximum value in the case where the IDT electrode includes only the Al layer is indicated by the straight broken line as a normalized film thickness. The same applies to FIG. 6 and the subsequent figures showing the Q characteristic.

As shown in FIG. 5, it can be seen that in the case where the Mo layer as the high acoustic impedance metal layer is laminated closer to the piezoelectric layer than the Al layer, at least when the relationship of the normalized film thickness is $T \leq T_0$, the Q characteristic is superior to that in the case where the IDT electrode includes only the Al layer. The same applies to the case shown in FIG. 6. Thus, in the case of $T \leq T_0$, the Q characteristic can be improved. Therefore, the energy loss can be reduced.

Here, in the relationship of $T \leq T_0$, Expression 1 can be derived by applying the above-described approximate expression of $T_0$.

$T \leq 0.1125 t_{LT} + 0.0574$  Expression 1

By satisfying Expression 1, the Q characteristic can be improved, and the energy loss can be reduced. Further, in the following description, it is shown that the Q characteristic can be improved by satisfying Expression 1 even in a case where the high acoustic impedance metal layer is other than the Mo layer.

The Q characteristics of the acoustic wave device under the same or substantially the same conditions as the conditions under which the Q characteristics shown in FIG. 5 and FIG. 6 were obtained except that the Mo layer of the IDT electrode was replaced with another high acoustic impedance metal layer, are shown in FIG. 7 to FIG. 10 below. In the case where the high acoustic impedance metal layer was a W layer, the film thickness of the W layer was about 0.5%, about 1%, or about 2%. In the case where the high acoustic impedance metal layer was an Ru layer, the film thickness of the Ru layer was about 1%, about 2%, or about 3%.

Figure 7:
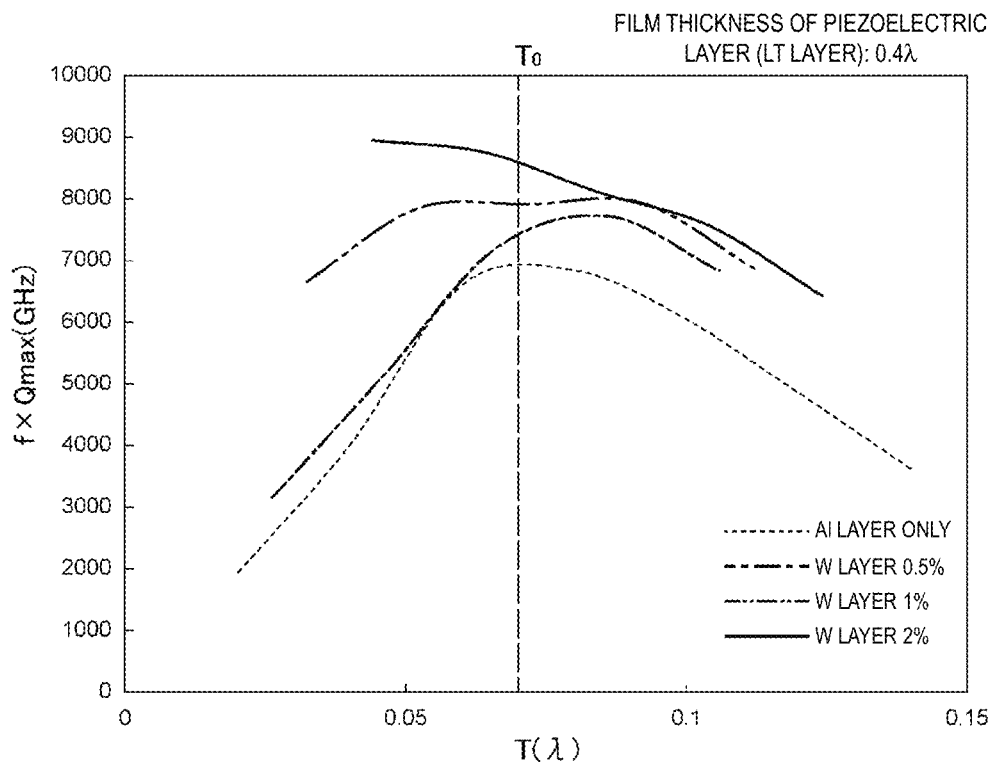
FIG. 7 is a diagram showing Q characteristics in the case where the IDT electrode includes only an Al layer or a W layer and an Al layer, and the piezoelectric layer has a film thickness of about 0.4λ.
Figure 8:
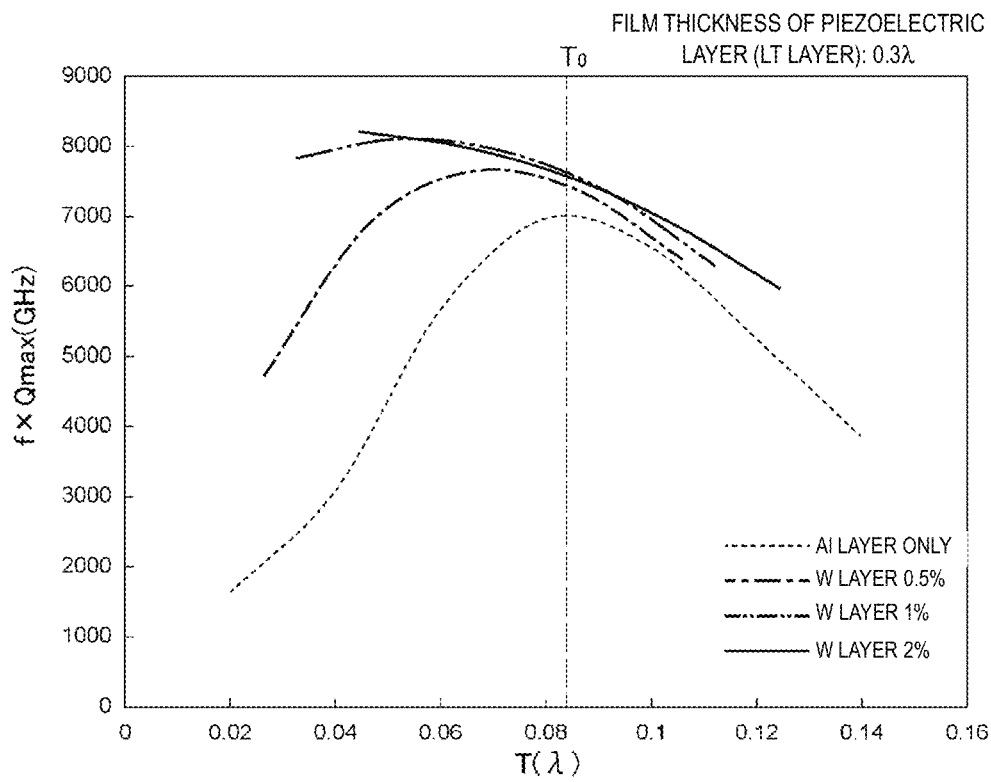
FIG. 8 is a diagram showing Q characteristics in the case where the IDT electrode includes only an Al layer or a W layer and an Al layer, and the piezoelectric layer has a film thickness of about 0.3λ.

FIG. 7 is a diagram showing Q characteristics in the case where the IDT electrode includes only an Al layer or a W layer and an Al layer, and the piezoelectric layer has a film thickness of about 0.4λ. FIG. 8 is a diagram showing Q characteristics in the case where the IDT electrode includes only an Al layer or a W layer and an Al layer, and the piezoelectric layer has a film thickness of about 0.3λ. In FIG. 7 and FIG. 8, the alternate long and short dash line indicates the result in the case the film thickness of the W layer is about 0.5%, the alternate long and two short dashes line indicates the result in the case where the film thickness of the W layer is about 1%, and the solid line indicates the result in the case where the film thickness of the W layer is about 2%. The broken line indicates the result in the case where the IDT electrode includes only the Al layer.

As shown in FIG. 7, it can be seen that in the case where the W layer as the high acoustic impedance metal layer is laminated closer to the piezoelectric layer than the Al layer, at least when the relationship of the normalized film thickness is $T \leq T_0$, the Q characteristic is superior to that in the case where the IDT electrode includes only the Al layer. The same applies to the case shown in FIG. 8. As described above, even in the case where the high acoustic impedance metal layer is the W layer, the Q characteristic can be improved and the energy loss can be reduced by satisfying the Expression 1.

Figure 9:
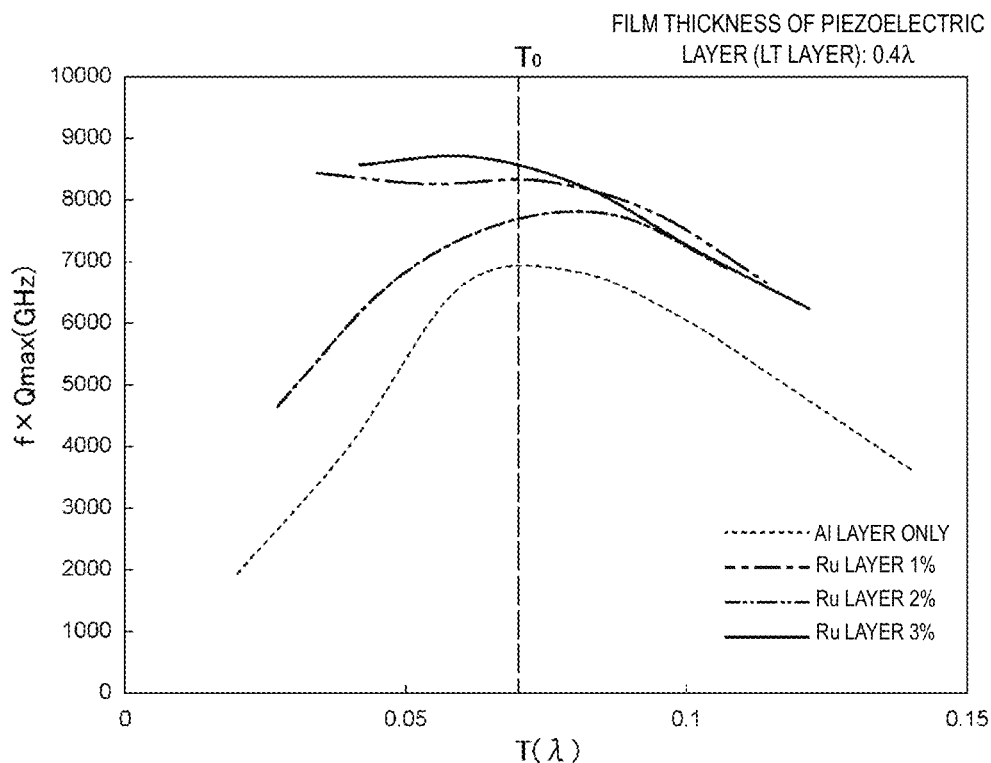
FIG. 9 is a diagram showing Q characteristics in the case where the IDT electrode includes only an Al layer or an Ru layer and an Al layer, and the piezoelectric layer has a film thickness of about 0.4λ.
Figure 10:
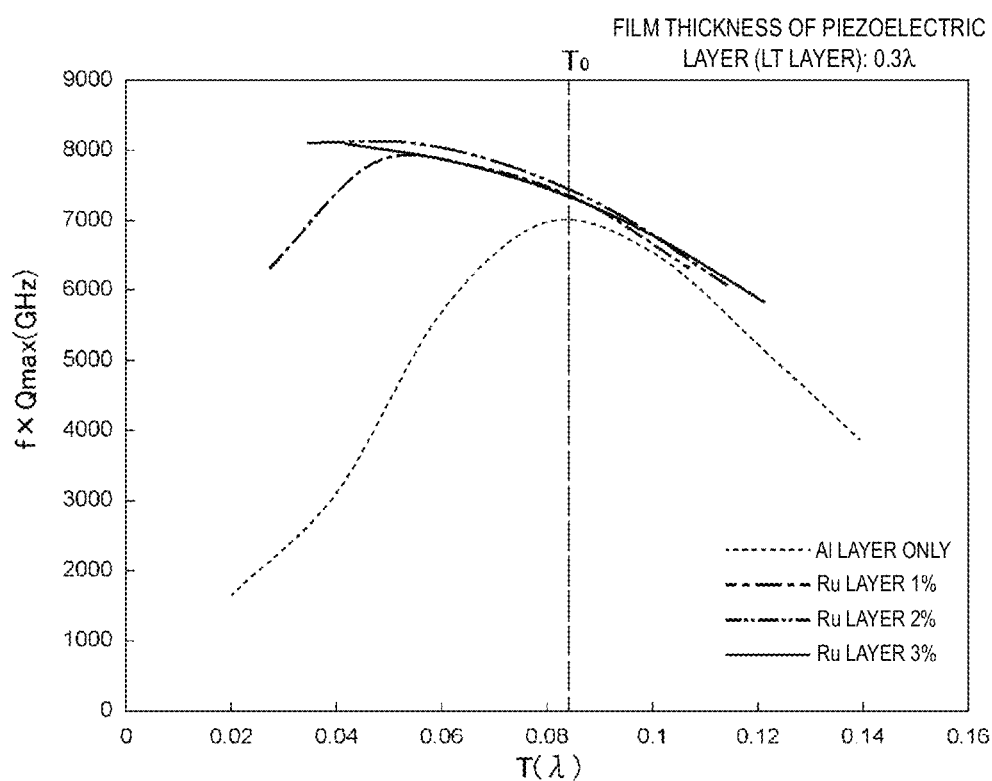
FIG. 10 is a diagram showing Q characteristics in the case where the IDT electrode includes only an Al layer or an Ru layer and an Al layer, and the piezoelectric layer has a film thickness of about 0.3λ.

FIG. 9 is a diagram showing Q characteristics in the case where the IDT electrode includes only an Al layer or an Ru layer and an Al layer, and the piezoelectric layer has a film thickness of about 0.4λ. FIG. 10 is a diagram showing Q characteristics in the case where the IDT electrode includes only an Al layer or an Ru layer and an Al layer, and the piezoelectric layer has a film thickness of about 0.3λ. In FIG. 9 and FIG. 10, the alternate long and short dash line indicates the result in the case where the film thickness of the Ru layer is about 1%, the alternate long and two short dashes line indicates the result in the case where the film thickness of the Ru layer is about 2%, and the solid line indicates the result in the case where the film thickness of the Ru layer is about 3%. The broken line indicates the result in the case where the IDT electrode includes only the Al layer.

As shown in FIG. 9, it can be seen that in the case where the Ru layer as the high acoustic impedance metal layer is laminated closer to the piezoelectric layer than the Al layer, at least when the relationship of the normalized film thickness is $T \leq T_0$, the Q characteristic is superior to that in the case where the IDT electrode includes only the Al layer. The same applies to the case shown in FIG. 10. As described above, even in the case where the high acoustic impedance metal layer is the Ru layer, the Q characteristic can be improved and the energy loss can be reduced by satisfying the Expression 1.

Furthermore, the Q characteristic may be improved not only in the case where the total film thickness T of each layer of the electrode finger of the IDT electrode is equal to or less than the normalized film thickness $T_0$, but also in the case where the total film thickness T of each layer of the electrode finger of the IDT electrode is larger than the normalized film thickness $T_0$. The inventors of preferred embodiments of the present invention have discovered conditions under which the Q characteristic can be improved both in the case of $T \leq T_0$ and in the case of $T > T_0$. $T_0$ be more specific, the following Expression 2 is satisfied and the respective coefficients in Expression 2 and the metal of the high acoustic impedance metal layer are combinations as shown in Table 2, wherein it is possible to improve the Q characteristic both in the case of $T \leq T_0$ and in the case of $T > T_0$. That is, when T has any value, the Q characteristic can be improved. Therefore, the energy loss can be further reliably reduced.

$$a_0^{(2)}(t_{LT}-c_0)^2 + a_0^{(1)}(t_{LT}-c_0) + b_0 \leq a_{LT}^{(2)}(t_{LT}-c_{LT})^2 + a_{LT}^{(1)}(t_{LT}-c_{LT}) + a_M^{(2)}(T-c_M)^2 + a_M^{(1)}(T-c_M) + d_{LT-M}(t_{LT}-c_{LT})(T-c_M) + b$$ Expression 2

In the case where Expression 2 is satisfied and the respective coefficients in Expression 2 and the metal of the high acoustic impedance metal layer are the combinations shown in Table 2, Expression 1 may not be satisfied. However, it is preferable to satisfy Expression 1.

The Al metal layer 15 in the IDT electrode 8 illustrated in FIG. 1 is an Al layer, and the film thickness of the Al layer is preferably equal to or more than about 85 nm. As a result, the electric resistance value can be stabilized even when the film thickness of the Al layer varies during the formation of the Al layer. This will be described with reference to FIG. 11 below. Note that FIG. 11 shows normalized conductivity obtained by normalized conductivity by the film thickness of the Al layer.

Figure 11:
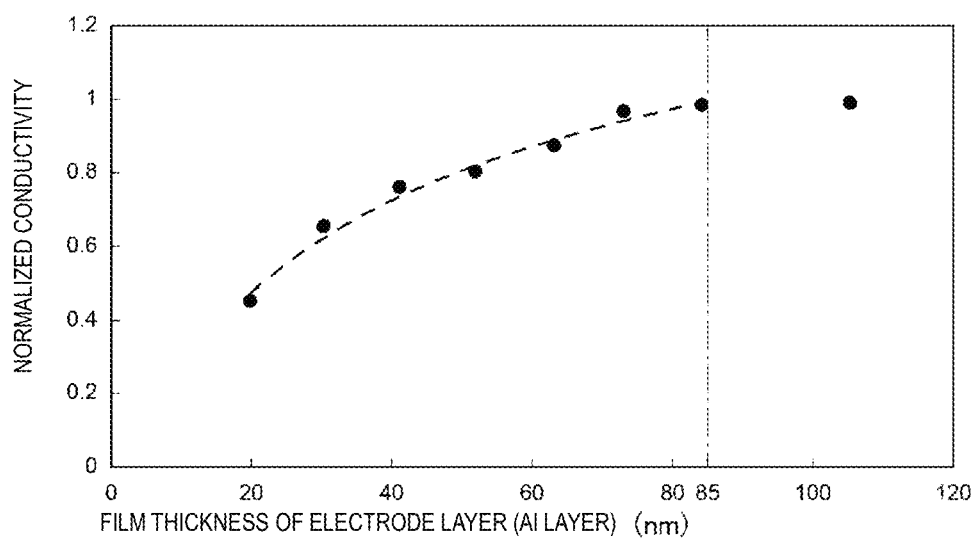
FIG. 11 is a diagram showing the relationship between the film thickness of an Al layer and normalized conductivity.

FIG. 11 is a diagram showing the relationship between the film thickness of the Al layer and the normalized conductivity. In FIG. 11, each plot indicates the normalized conductivity at each film thickness of the Al layer. The broken line in FIG. 11 indicates the relationship of Expression 3 described later.

As shown in FIG. 11, it can be seen that the normalized conductivity increases as the film thickness of the Al layer increases and the value approaches about 85 nm. It can be seen that the normalized conductivity is constant when the film thickness of the Al layer is equal to or more than about 85 nm. Therefore, by setting the film thickness of the Al layer to equal to or more than about 85 nm, the electric resistance value can be stabilized.

Note that the relationship between the film thickness of the Al layer and the normalized conductivity shown in FIG. 11 can be expressed by the following Expression 3. Here, it is assumed that i is the metal type, $h_i$ is the film thickness of the metal type i, $\kappa$ is the conductivity, and $\kappa_{sat}$ is a saturation conductivity. However, in the first preferred embodiment, the metal type i is Al.

$$\kappa(h_i) = \kappa_{sat}\{0.36 \ln(h_i) - 0.6\}$$ Expression 3

Expression 3 is an expression in the case where the film thickness $h_i$ is smaller than a critical film thickness $h_{i-sat}$ at which the conductivity $\kappa$ becomes the saturation conductivity $\kappa_{sat}$. When the film thickness $h_i$ exceeds the critical film thickness $h_{i-sat}$, the relationship of $\kappa(h_i) = \kappa_{sat}$ is maintained for the conductivity $\kappa$. The critical film thickness $h_{i-sat}$ is a film thickness $h_i$ when $\{0.36 \ln(h_i) - 0.6\}$ in Expression 3 is 1 and $\kappa(h_i) = \kappa_{sat}$ is established. More particularly, the critical film thickness $h_{i-sat}$ is about 85.15 nm. As is clear from this, by setting the film thickness of the Al layer to be equal to or more than about 85 nm, the conductivity can be stabilized, and the electric resistance value can be stabilized.

Figure 12:
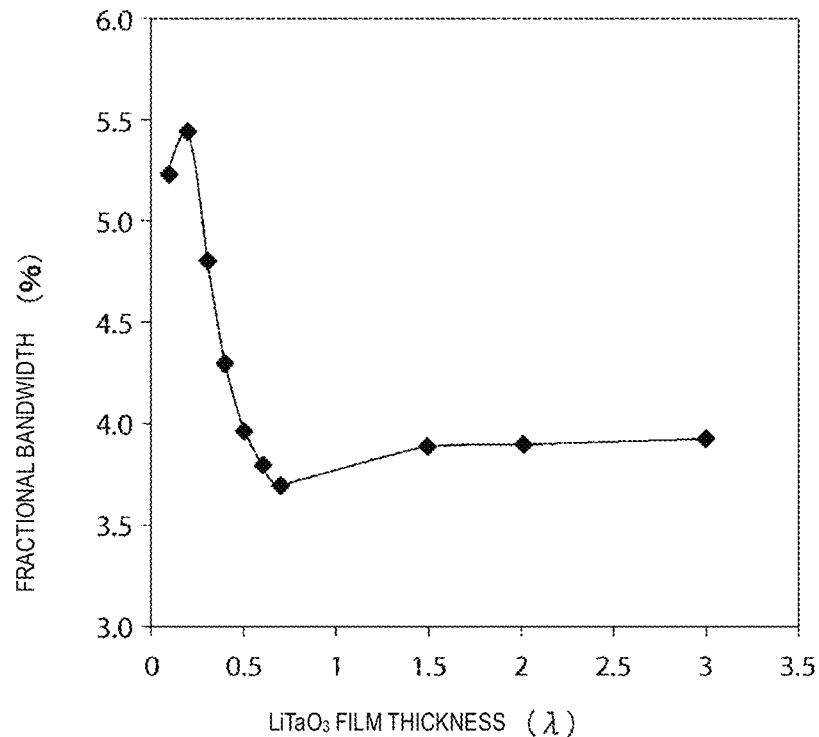
FIG. 12 is a diagram showing the relationship between the thickness of the piezoelectric layer made of $LiTaO_3$ and fractional bandwidth.

As shown in FIG. 12, when the film thickness of the LiTaO$_3$ film as the piezoelectric layer 7 is in the range of equal to or more than about 0.05λ and equal to or less than about 0.5λ, the fractional bandwidth significantly varies. Accordingly, the electromechanical coupling coefficient can be adjusted in a wider range. Therefore, in order to widen the adjustment range of the electromechanical coupling coefficient and the fractional bandwidth, the film thickness of the piezoelectric layer 7 is preferably in the range of equal to or more than about 0.05λ and equal to or less than about 0.5λ, for example.

Figure 13:
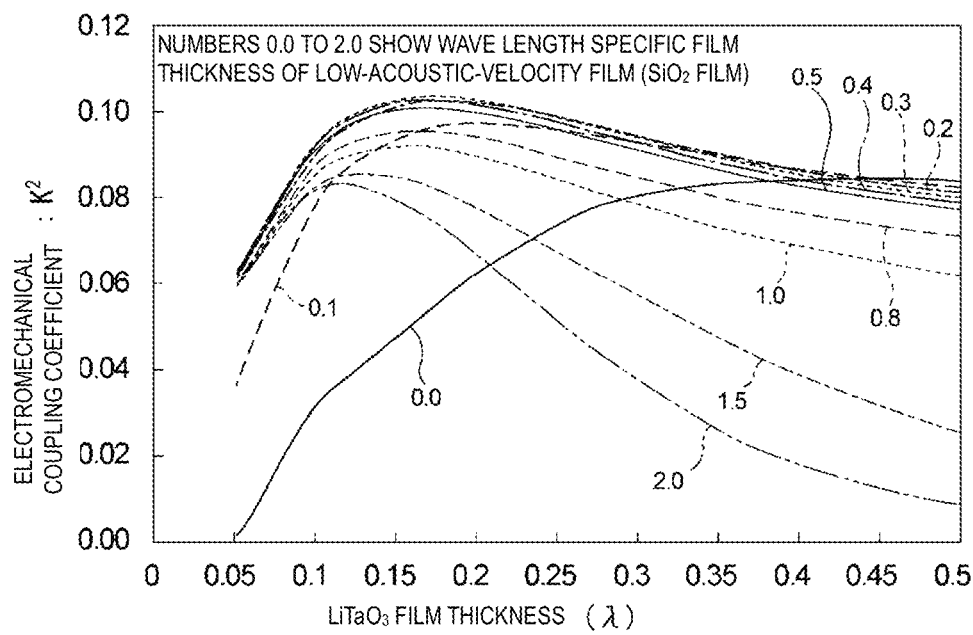
FIG. 13 is a diagram showing the relationship between the film thickness of the piezoelectric layer made of $LiTaO_3$, a wavelength specific film thickness of a low-acoustic-velocity film made of $SiO_2$, and an electromechanical coupling coefficient.

As shown in FIG. 13, when the film thickness of the LiTaO$_3$ film as the piezoelectric layer 7 is in the range of equal to or more than about 0.05λ and equal to or less than about 0.35 λ, the electromechanical coupling coefficient can be further increased. As a result, a state of spurious can be avoided. Therefore, the film thickness of the piezoelectric layer 7 is more preferably in the range of equal to or more than about 0.05λ and equal to or less than about 0.35λ, for example.

As illustrated in FIG. 1, in the first preferred embodiment, the energy confinement layer 3 is a multilayer body including the high-acoustic-velocity support substrate 5 and the low-acoustic-velocity film 6, but the configuration of the energy confinement layer 3 is not limited thereto. Hereinafter, first to third modifications of the first preferred embodiment in which the configuration of the energy confinement layer is different from that of the first preferred embodiment will be described. Also in the first to third modifications, similarly to the first preferred embodiment, the Q characteristic can be improved, and the energy loss can be reduced.

Figure 14:
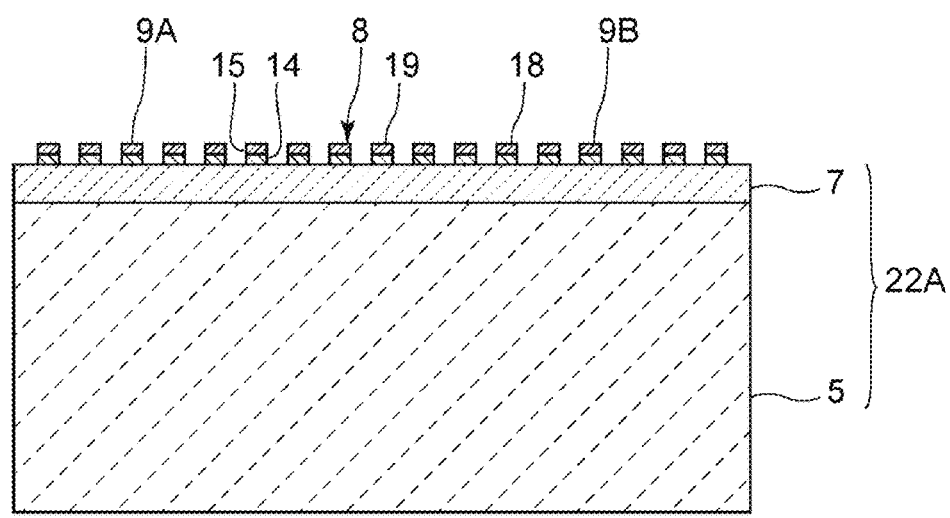
FIG. 14 is a front sectional view of an acoustic wave device according to a first modification of the first preferred embodiment of the present invention.

In the first modification illustrated in FIG. 14, a piezoelectric substrate 22A includes the high-acoustic-velocity support substrate 5 and the piezoelectric layer 7 provided directly on the high-acoustic-velocity support substrate 5. The energy confinement layer of this modification is the high-acoustic-velocity support substrate 5.

Figure 15:
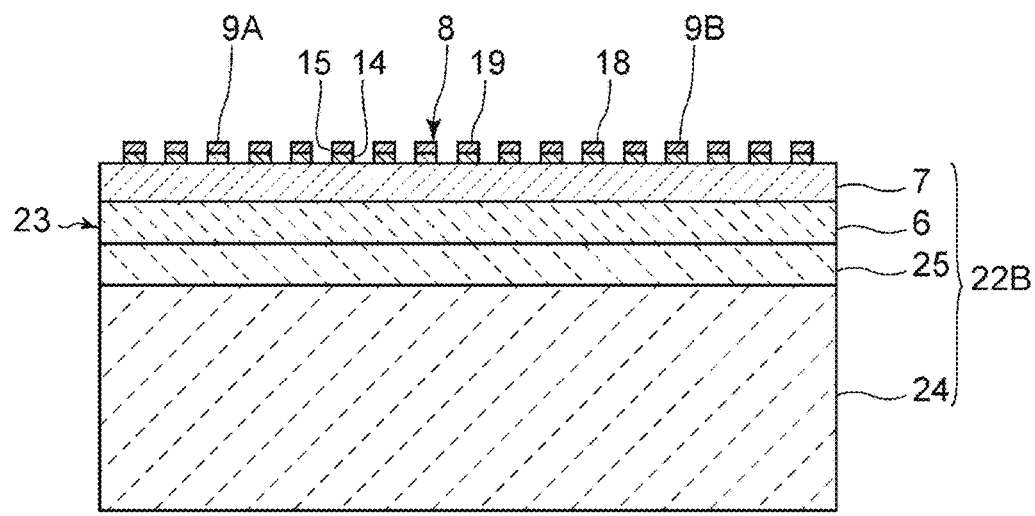
FIG. 15 is a front sectional view of an acoustic wave device according to a second modification of the first preferred embodiment of the present invention.

In the second modification illustrated in FIG. 15, a piezoelectric substrate 22B includes a support substrate 24, a high-acoustic-velocity film 25 provided on the support substrate 24, the low-acoustic-velocity film 6 provided on the high-acoustic-velocity film 25, and the piezoelectric layer 7 provided on the low-acoustic-velocity film 6. The high-acoustic-velocity material layer of this modification is the high-acoustic-velocity film 25. An energy confinement layer 23 is a multilayer body of the high-acoustic-velocity film 25 and the low-acoustic-velocity film 6.

As the material of the high-acoustic-velocity film 25, for example, aluminum oxide, silicon carbide, silicon nitride, silicon oxynitride, silicon, sapphire, lithium tantalate, lithium niobate, crystal, alumina, zirconia, cordierite, mullite, steatite, forsterite, magnesia, a diamond-like carbon (DLC) film, diamond, or the like, and media containing these materials as a main component can be used.

Examples of the material of the support substrate 24 include, for example, piezoelectric materials such as aluminum oxide, lithium tantalate, lithium niobate, and quartz; various ceramics such as alumina, magnesia, silicon nitride, aluminum nitride, silicon carbide, zirconia, cordierite, mullite, steatite, and forsterite; dielectrics such as sapphire, diamond, and glass; semiconductors such as silicon and gallium nitride; and resins.

Figure 16:
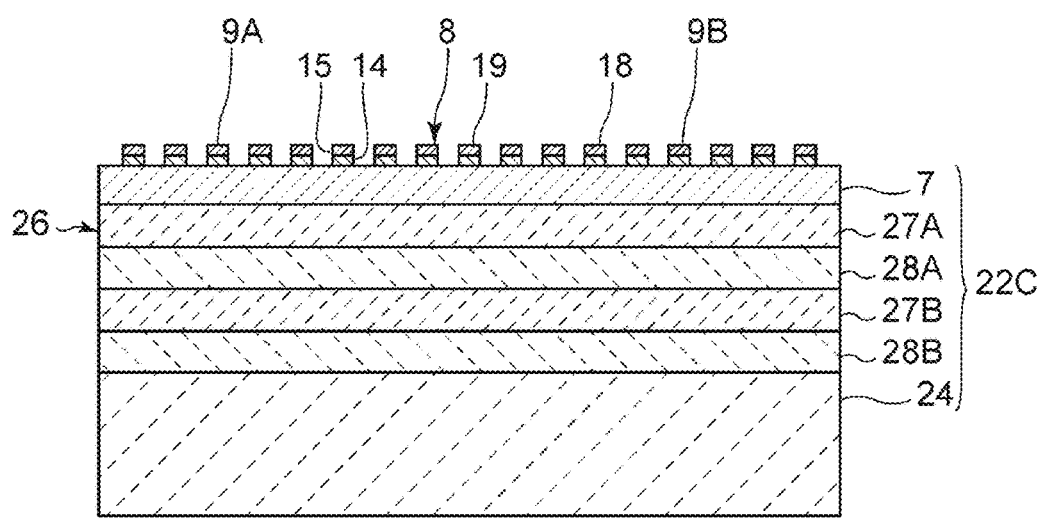
FIG. 16 is a front sectional view of an acoustic wave device according to a third modification of the first preferred embodiment of the present invention.

In the third modification illustrated in FIG. 16, a piezoelectric substrate 22C includes the support substrate 24, an acoustic reflection film 26 provided on the support substrate 24, and the piezoelectric layer 7 provided on the acoustic reflection film 26. The energy confinement layer of this modification is the acoustic reflection film 26.

The acoustic reflection film 26 is a multilayer body including a plurality of acoustic impedance layers. To be more specific, the acoustic reflection film 26 includes a low acoustic impedance layer 27A and a low acoustic impedance layer 27B that have a relatively low acoustic impedance, and a high acoustic impedance layer 28A and a high acoustic impedance layer 28B that have a relatively high acoustic impedance. In this modification, low acoustic impedance layers and high acoustic impedance layers are alternately laminated in the acoustic reflection film 26. Note that the low acoustic impedance layer 27A is located closest to the piezoelectric layer 7 in the acoustic reflection film 26.

The acoustic reflection film 26 includes two low acoustic impedance layers and two high acoustic impedance layers. However, the acoustic reflection film 26 may include at least one low acoustic impedance layer and at least one high acoustic impedance layer.

As a material of the low acoustic impedance layer, for example, silicon oxide, aluminum, or the like can be used.

As a material of the high acoustic impedance layer, for example, a metal such as platinum or tungsten, or a dielectric such as aluminum nitride or silicon nitride can be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   an energy confinement layer;
   a piezoelectric layer on the energy confinement layer and made of Y-cut X-propagation lithium tantalate having a cut angle of equal to or more than about −10° and equal to or less than about 65°; and
   an IDT electrode on the piezoelectric layer; wherein
   the IDT electrode includes a plurality of electrode fingers, the plurality of electrode fingers including a multilayer body including an Al metal layer defined by an Al layer or an alloy layer including Al, and a high acoustic impedance metal layer that has a Young's modulus equal to or more than about 200 GPa and a higher acoustic impedance than an acoustic impedance of Al;
   the high acoustic impedance metal layer is closer to the piezoelectric layer than the Al metal layer;
   when a wavelength defined by an electrode finger pitch of the IDT electrode is denoted by $\lambda$ and a wavelength specific film thickness of the piezoelectric layer is denoted by $t_{LT}$, $t_{LT} \leq 1\lambda$ is satisfied; and
   a total of normalized film thicknesses obtained by normalizing a film thickness of each layer of the plurality of electrode fingers by a density and a Young's modulus of the Al metal layer is denoted by T, the expression $T \leq 0.1125 t_{LT} + 0.0574$ is satisfied.

2. The acoustic wave device according to claim 1, wherein the Al metal layer is an Al layer, and a film thickness of the Al metal layer is equal to or more than about 85 nm.

3. The acoustic wave device according to claim 1, wherein
   the energy confinement layer includes a high-acoustic-velocity material layer; and
   an acoustic velocity of a bulk wave propagating through the high-acoustic-velocity material layer is higher than an acoustic velocity of an acoustic wave propagating through the piezoelectric layer.

4. The acoustic wave device according to claim 3, wherein
   the energy confinement layer includes a low-acoustic-velocity film between the high-acoustic-velocity material layer and the piezoelectric layer; and
   an acoustic velocity of a bulk wave propagating through the low-acoustic-velocity film is lower than an acoustic velocity of a bulk wave propagating through the piezoelectric layer.

5. The acoustic wave device according to claim 3, wherein the high-acoustic-velocity material layer is a high-acoustic-velocity support substrate.

6. The acoustic wave device according to claim 4, further comprising:
   a support substrate; wherein
   the high-acoustic-velocity material layer is a high-acoustic-velocity film provided between the support substrate and the low-acoustic-velocity film.

7. The acoustic wave device according to claim 1, further comprising:
   a support substrate, wherein
   the energy confinement layer is an acoustic reflection film provided on the support substrate;
   the acoustic reflection film includes a high acoustic impedance layer having a relatively high acoustic impedance and a low acoustic impedance layer having a relatively low acoustic impedance, the high acoustic impedance layer and the low acoustic impedance layer being alternately laminated; and
   the piezoelectric layer is provided on the acoustic reflection film.

8. The acoustic wave device according to claim 1, wherein the piezoelectric layer has a film thickness of equal to or more than about 0.05$\lambda$ and equal to or less than about 0.5$\lambda$.

9. The acoustic wave device according to claim 8, wherein the piezoelectric layer has a film thickness of equal to or more than about 0.05$\lambda$ and equal to or less than about 0.35$\lambda$.

10. An acoustic wave device comprising:
    an energy confinement layer;
    a piezoelectric layer on the energy confinement layer and made of Y-cut X-propagation lithium tantalate having a cut angle of equal to or more than about −10° and equal to or less than about 65°; and
    an IDT electrode on the piezoelectric layer; wherein
    the IDT electrode includes a plurality of electrode fingers, the plurality of electrode fingers including a multilayer body including an Al metal layer defined by an Al layer or an alloy layer including Al, and a high acoustic impedance metal layer that has a Young's modulus equal to or more than about 200 GPa and a higher acoustic impedance than an acoustic impedance of Al;
    the high acoustic impedance metal layer is located closer to the piezoelectric layer than the Al metal layer;
    the high acoustic impedance metal layer is an Mo layer, a W layer, or an Ru layer;
    the following Expression 2 is satisfied; and
    a combination of each coefficient of Expression 2 and a metal of the high acoustic impedance metal layer is a combination shown in Table 1 below:

$$a_0^{(2)}(t_{LT}-c_0)^2 + a_0^{(1)}(t_{LT}-c_0) + b_0 \leq a_{LT}^{(2)}(t_{LT}-c_{LT})^2 + a_{LT}^{(1)}(t_{LT}-c_{LT}) + a_M^{(2)}(T-c_M)^2 + a_M^{(1)}(T-c_M) + d_{LT-M}(t_{LT}-c_{LT})(T-c_M) + b$$ Expression 2;

TABLE 1

| | METAL FORMING HIGH ACOUSTIC IMPEDANCE METAL LAYER | | |
|---|---|---|---|
| COEFFICIENT | Mo | W | Ru |
| $a_0^{(2)}$ | | 12315.2368 | |
| $a_0^{(1)}$ | | 2360.5990 | |
| $c_0$ | | 0.2250 | |
| $b_0$ | | 6287.8999 | |
| $a_{LT}^{(2)}$ | −54656.6400 | −57176.4500 | −51809.7600 |
| $a_{LT}^{(1)}$ | 12799.3184 | 10774.6530 | 13577.4784 |
| $c_{LT}$ | 0.2250 | 0.2250 | 0.2250 |
| $a_M^{(2)}$ | −256136.5936 | −252048.6950 | −177802.3113 |
| $a_M^{(1)}$ | −22623.1348 | −15612.4350 | −22797.2384 |

TABLE 1-continued

| | METAL FORMING HIGH ACOUSTIC IMPEDANCE METAL LAYER | | |
|---|---|---|---|
| COEFFICIENT | Mo | W | Ru |
| cM | 0.0844 | 0.0851 | 0.0816 |
| dLT-M | 0.0000 | 72370.3153 | 0.0000 |
| b | 6481.5295 | 6416.9953 | 6416.0623 |

11. The acoustic wave device according to claim 2, wherein the Al metal layer is an Al layer, and a film thickness of the Al metal layer is equal to or more than about 85 nm.

12. The acoustic wave device according to claim 10, wherein
the energy confinement layer includes a high-acoustic-velocity material layer; and
an acoustic velocity of a bulk wave propagating through the high-acoustic-velocity material layer is higher than an acoustic velocity of an acoustic wave propagating through the piezoelectric layer.

13. The acoustic wave device according to claim 12, wherein
the energy confinement layer includes a low-acoustic-velocity film between the high-acoustic-velocity material layer and the piezoelectric layer; and
an acoustic velocity of a bulk wave propagating through the low-acoustic-velocity film is lower than an acoustic velocity of a bulk wave propagating through the piezoelectric layer.

14. The acoustic wave device according to claim 12, wherein the high-acoustic-velocity material layer is a high-acoustic-velocity support substrate.

15. The acoustic wave device according to claim 13, further comprising:
a support substrate; wherein
the high-acoustic-velocity material layer is a high-acoustic-velocity film provided between the support substrate and the low-acoustic-velocity film.

16. The acoustic wave device according to claim 10, further comprising:
a support substrate; wherein
the energy confinement layer is an acoustic reflection film provided on the support substrate;
the acoustic reflection film includes a high acoustic impedance layer having a relatively high acoustic impedance and a low acoustic impedance layer having a relatively low acoustic impedance, the high acoustic impedance layer and the low acoustic impedance layer being alternately laminated; and
the piezoelectric layer is provided on the acoustic reflection film.

17. The acoustic wave device according to claim 10, wherein the piezoelectric layer has a film thickness of equal to or more than about $0.05\lambda$ and equal to or less than about $0.5\lambda$.

18. The acoustic wave device according to claim 17, wherein the piezoelectric layer has a film thickness of equal to or more than about $0.05\lambda$ and equal to or less than about $0.35\lambda$.

\* \* \* \* \*